(12) United States Patent
Song

(10) Patent No.: US 11,355,483 B2
(45) Date of Patent: Jun. 7, 2022

(54) LIGHTING DEVICE COMPRISING ORGANIC LIGHT EMITTING PANEL AND INORGANIC LIGHT EMITTING DIODE

(71) Applicant: LG Display Co., Ltd., Seoul (KR)

(72) Inventor: TaeJoon Song, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 244 days.

(21) Appl. No.: 16/721,464

(22) Filed: Dec. 19, 2019

(65) Prior Publication Data

US 2020/0212025 A1  Jul. 2, 2020

(30) Foreign Application Priority Data

Dec. 31, 2018  (KR) .................. 10-2018-0173343

(51) Int. Cl.
| | | |
|---|---|---|
| *H01L 25/16* | (2006.01) | |
| *H01L 27/32* | (2006.01) | |
| *H01L 51/52* | (2006.01) | |
| *H01L 51/56* | (2006.01) | |

(52) U.S. Cl.
CPC ........ *H01L 25/167* (2013.01); *H01L 27/3288* (2013.01); *H01L 51/5271* (2013.01)

(58) Field of Classification Search
CPC ... H01L 25/167; H01L 51/52; H01L 51/5212; H01L 51/5215; H01L 51/5221; H01L 51/5253; H01L 51/5271; H01L 51/5275; H01L 51/529; H01L 2251/5361; H01L 27/286; H01L 27/3225; H01L 27/3227; H01L 27/3276; H01L 27/3288; H01L 33/58; H01L 33/60; H01L 33/62; H01L 33/642; H01L 23/62; F21Y 2115/15
See application file for complete search history.

(56) References Cited

U.S. PATENT DOCUMENTS

| | | | | |
|---|---|---|---|---|
| 5,583,349 | A * | 12/1996 | Norman | H01L 25/0753 257/103 |
| 8,592,881 | B2 * | 11/2013 | Lee | H01L 27/3227 257/292 |
| 8,866,416 | B2 * | 10/2014 | Burrows | H01L 27/3225 315/312 |
| 8,915,121 | B2 * | 12/2014 | Kumar | B82Y 20/00 73/31.03 |
| 9,716,082 | B2 | 7/2017 | Bower et al. | |
| 9,818,804 | B2 * | 11/2017 | Hack | H01L 27/3225 |

(Continued)

FOREIGN PATENT DOCUMENTS

| | | | | |
|---|---|---|---|---|
| DE | 10 2015 100 253 | * | 7/2016 | ............. F21V 14/00 |
| GB | 2496183 | * | 5/2013 | ............. H01L 25/16 |

(Continued)

*Primary Examiner* — Mary A Wilczewski
(74) *Attorney, Agent, or Firm* — Seed Intellectual Property Law Group LLP

(57) ABSTRACT

A lighting device comprises an organic light emitting panel, an inorganic light emitting diode on the organic light emitting panel, and a first lens structure at least partially surrounding the inorganic light emitting diode. The organic light emitting panel may include a base substrate, an auxiliary electrode on the base substrate, a first electrode on the auxiliary electrode, a passivation layer on the first electrode, a light emitting layer on the first electrode, a second electrode on the light emitting layer, and an encapsulation layer on the second electrode.

17 Claims, 10 Drawing Sheets

(56) References Cited

U.S. PATENT DOCUMENTS

| | | | |
|---|---|---|---|
| 10,242,975 B2* | 3/2019 | Kim | H01L 51/5253 |
| 10,381,335 B2* | 8/2019 | Sasaki | G09G 3/006 |
| 10,804,326 B2* | 10/2020 | Maindron | H01L 51/56 |
| 10,811,403 B2* | 10/2020 | Sasaki | H01L 27/3225 |
| 11,081,670 B2* | 8/2021 | Chung | H01L 51/5237 |
| 2006/0012289 A1* | 1/2006 | Shiang | H01L 27/3204 313/504 |
| 2007/0222397 A1* | 9/2007 | Shiang | H01L 27/3225 315/250 |
| 2009/0201230 A1* | 8/2009 | Smith | G09G 3/3283 345/76 |
| 2009/0262545 A1* | 10/2009 | Amelung | B60Q 1/44 362/487 |
| 2012/0313113 A1* | 12/2012 | Chen | H01L 27/288 257/84 |
| 2015/0008390 A1* | 1/2015 | Lewis | H01L 27/288 257/13 |
| 2015/0092137 A1* | 4/2015 | Kim | H01L 33/504 349/69 |
| 2016/0064363 A1* | 3/2016 | Bower | H01L 25/0753 315/294 |
| 2017/0025484 A1* | 1/2017 | Forrest | H01L 51/56 |
| 2017/0040391 A1* | 2/2017 | Li | H01L 27/3227 |
| 2017/0062531 A1* | 3/2017 | Hack | B81B 3/0083 |
| 2017/0084671 A1* | 3/2017 | Hack | H01L 27/3225 |
| 2017/0179092 A1* | 6/2017 | Sasaki | G09G 3/006 |
| 2017/0294425 A1* | 10/2017 | Kim | H01L 51/0097 |
| 2018/0166512 A1* | 6/2018 | Hack | H01L 27/3213 |
| 2019/0013365 A1* | 1/2019 | Lin | H01L 25/075 |
| 2019/0051709 A1* | 2/2019 | Puszka | G06K 9/0004 |
| 2019/0189967 A1 | 6/2019 | Lee | |
| 2019/0280048 A1* | 9/2019 | Maindron | H01L 33/007 |
| 2019/0355708 A1* | 11/2019 | Sasaki | H01L 27/3211 |
| 2020/0176519 A1* | 6/2020 | Seo | H01L 51/56 |
| 2020/0211437 A1* | 7/2020 | Ahn | G09G 3/20 |
| 2020/0212025 A1* | 7/2020 | Song | H01L 51/5271 |
| 2020/0287162 A1* | 9/2020 | Chung | H01L 27/3248 |
| 2021/0057492 A1* | 2/2021 | Xie | H01L 51/56 |

FOREIGN PATENT DOCUMENTS

| | | |
|---|---|---|
| KR | 10-2010-0125135 A | 11/2010 |
| KR | 10-2017-0034307 A | 3/2017 |
| KR | 10-2017-0047324 A | 5/2017 |
| KR | 10-2018-0117842 A | 10/2018 |
| KR | 10-2019-0074371 A | 6/2019 |

* cited by examiner

LIGHTING DEVICE COMPRISING ORGANIC LIGHT EMITTING PANEL AND INORGANIC LIGHT EMITTING DIODE

BACKGROUND

Technical Field

The present disclosure relates to a lighting device comprising an organic light emitting panel and an inorganic light emitting diode.

Description of the Related Art

Recently, studies for using an organic light emitting diode as a lighting device or a light source of a display device are actively ongoing based on many advantages of the organic light emitting diode.

If an organic light emitting diode is used, since it is easy to manufacture a surface light source or point light source, the organic light emitting diode is used for indoor lighting, outdoor lighting and vehicle lighting. For example, the organic light emitting diode is applied to a personal portable device such as a flash, an outdoor installation equipment such as a signboard, or a lighting device for a vehicle, such as indoor lighting, headlight, fog light, sidelight, license plate light, taillight, turn signal, and hazard flasher lamp.

The organic light emitting diode may have a flexible characteristic, and has an advantage in that it may be designed in various shapes. However, if the organic light emitting diode is used as a light source for a portion where light emission of high luminance is required, for example, brake light or reversing light of a vehicle, lifetime of the organic light emitting diode may be reduced.

An inorganic light emitting diode has advantages in that it may emit light at strong luminance and has excellent durability. However, if light sources of a lighting device are all comprised of inorganic light emitting diodes, yield may be deteriorated, and a manufacturing cost may be increased.

As described above, each of the organic light emitting diode and the inorganic light emitting diode has advantages and problems.

BRIEF SUMMARY

The present disclosure has been made in view of the above problems, and in various embodiments the present disclosure provides a lighting device comprising an organic light emitting panel and an inorganic light emitting diode.

In some embodiments, the present disclosure provides a lighting device that can use advantages of each of an organic light emitting diode and an inorganic light emitting diode and complement problems of each of the organic light emitting diode and the inorganic light emitting diode.

In some embodiments, the present disclosure provides a lighting device that can have a flexible characteristic, is easy to be designed in various shapes, and can emit light of strong luminance if necessary.

In accordance with one or more embodiments of the present disclosure, the above and other objects can be accomplished by the provision of a lighting device comprising an organic light emitting panel, an inorganic light emitting diode on the organic light emitting panel, and a first lens at least partially surrounding the inorganic light emitting diode, wherein the organic light emitting panel includes a base substrate, an auxiliary electrode on the base substrate, a first electrode on the auxiliary electrode, a passivation layer on the first electrode, a light emitting layer on the first electrode, a second electrode on the light emitting layer, and an encapsulation layer on the second electrode.

The passivation layer may be overlapped with the auxiliary electrode.

The passivation layer may be arranged between the first electrode and the light emitting layer.

The lighting device may further include a short reduction pattern including a groove formed in the first electrode and an insulating material in the groove.

The short reduction pattern may be connected with the passivation layer.

The lighting device may further include an n type electrode line and a p type electrode line on the organic light emitting panel, wherein the n type electrode line and the p type electrode line are spaced apart from each other and respectively connected with the inorganic light emitting diode.

At least a portion of each of the n type electrode line and the p type electrode line may be overlapped with the auxiliary electrode.

The n type electrode line and the p type electrode line may be arranged on the passivation layer.

The inorganic light emitting diode may further include an n type electrode, an n type semiconductor layer connected with the n type electrode, an active layer connected with the n type semiconductor layer, a p type semiconductor layer connected with the active layer, and a p type electrode connected with the p type semiconductor layer, and the n type electrode is connected with the n type electrode line, and the p type electrode is connected with the p type electrode line.

The lighting device may further include a conductor layer on the first lens.

The conductor layer may be connected with the second electrode of the organic light emitting panel.

The conductor layer may have a light reflective characteristic.

The conductor layer may be thermally conductive, and may have a thermal conductivity.

The lighting device may further include an adhesive layer on the conductor layer, and an encapsulation film on the adhesive layer, wherein the conductor layer is connected with the encapsulation film.

The lighting device may further include a second lens on the organic light emitting panel, wherein the inorganic light emitting diode is not arranged between the organic light emitting panel and the second lens. The second lens may be spaced laterally apart from the inorganic light emitting diode, and the second lens may contact the first lens.

The lighting device according to at least one embodiment of the present disclosure comprises the organic light emitting diode and the inorganic light emitting diode, and uses advantages of the organic light emitting diode and the inorganic light emitting diode. The lighting device according to at least one embodiment of the present disclosure can have a flexible characteristic, is easy to be designed in various shapes, and can generate light of strong luminance if necessary.

The lighting device according to at least one embodiment of the present disclosure may usefully be applied to a lighting device of a vehicle, such as indoor lighting, headlight, fog light, sidelight, license plate light, taillight, turn signal, hazard flasher lamp, brake light or reversing light.

In addition to the effects of the present disclosure as mentioned above, additional objects and features of the present disclosure will be clearly understood by those skilled in the art from the following description of the present disclosure.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
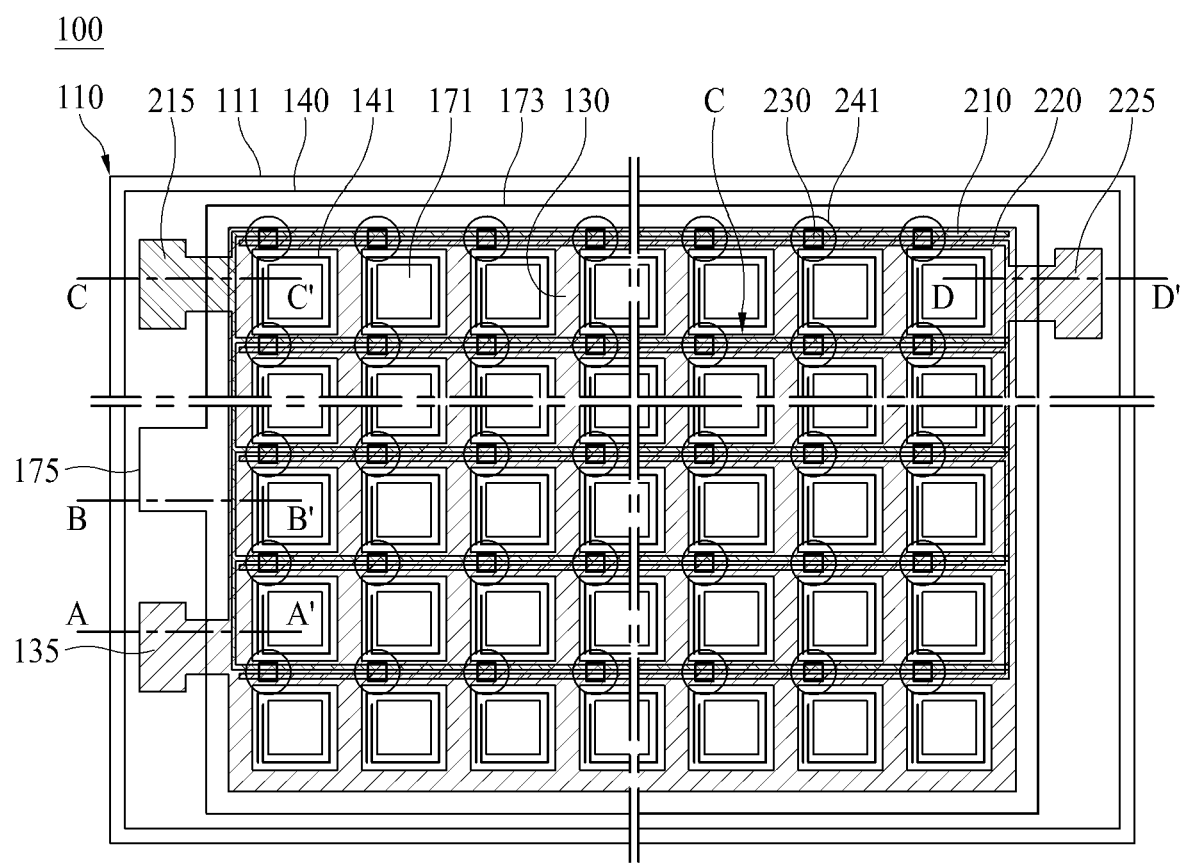
FIG. 1 is a plane view illustrating a lighting device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

Spatially relative terms such as "below", "beneath", "lower", "above", and "upper" may be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below", or "beneath" another device may be arranged "above" another device. Therefore, an exemplary term "below or beneath" may include "below or beneath" and "above" orientations. Likewise, an exemplary term "above" or "on" may include "above" and "below or beneath" orientations.

In describing a temporal relationship, for example, when the temporal order is described as "after," "subsequent," "next," and "before," a case which is not continuous may be included, unless "just" or "direct" is used.

It will be understood that, although the terms "first", "second", etc., may be used herein to describe various elements, these elements should not be limited by these terms. These terms are only used to partition one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

In the drawings describing the embodiments of the present disclosure, the same or similar elements are denoted by the same reference numerals even though they are depicted in different drawings.

Hereinafter, a lighting device 100 according to one embodiment of the present disclosure will be described in detail with reference to FIGS. 1, 2, 3 and 4.

Figure 2:
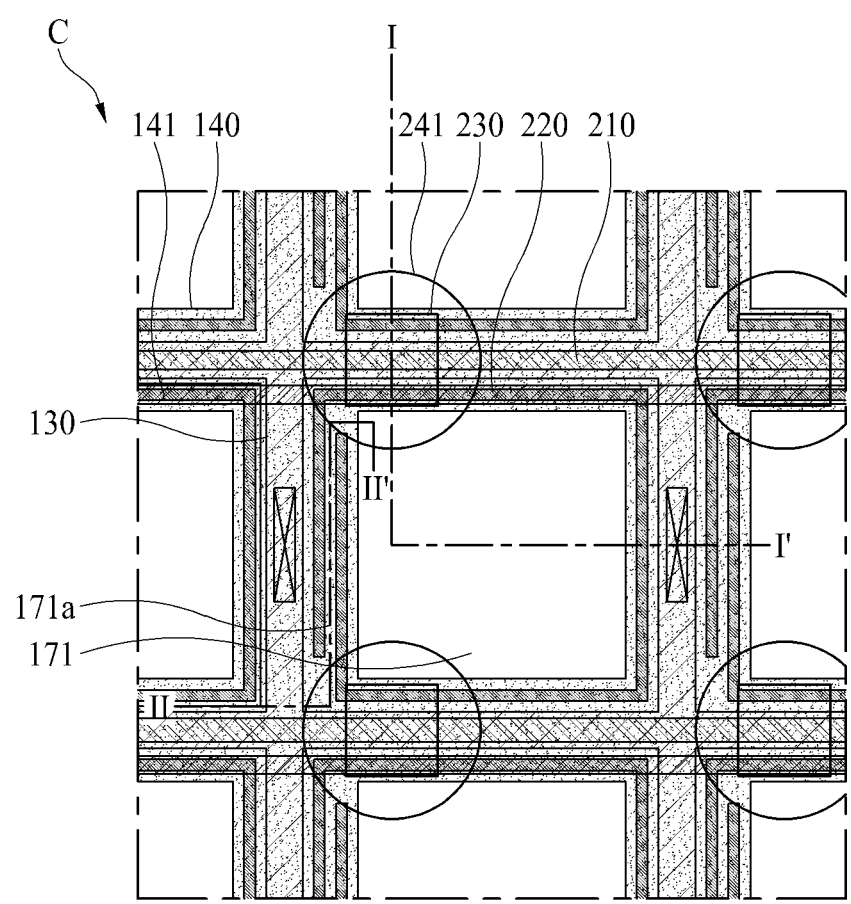
FIG. 2 is an enlarged view illustrating any one light emitting cell of FIG. 1.
Figure 3:
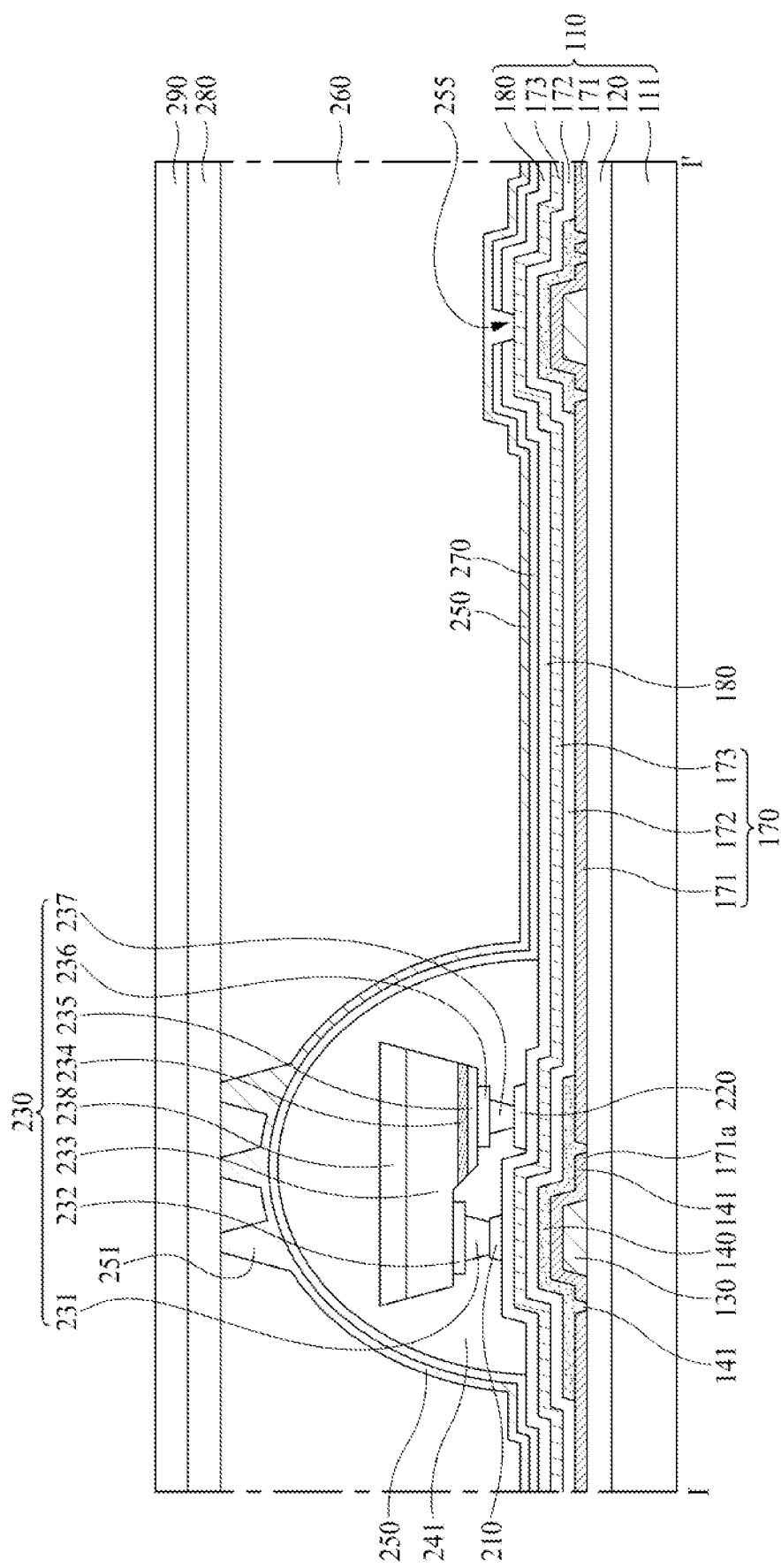
FIG. 3 is a cross-sectional view taken along line I-I' of FIG. 2.
Figure 4:
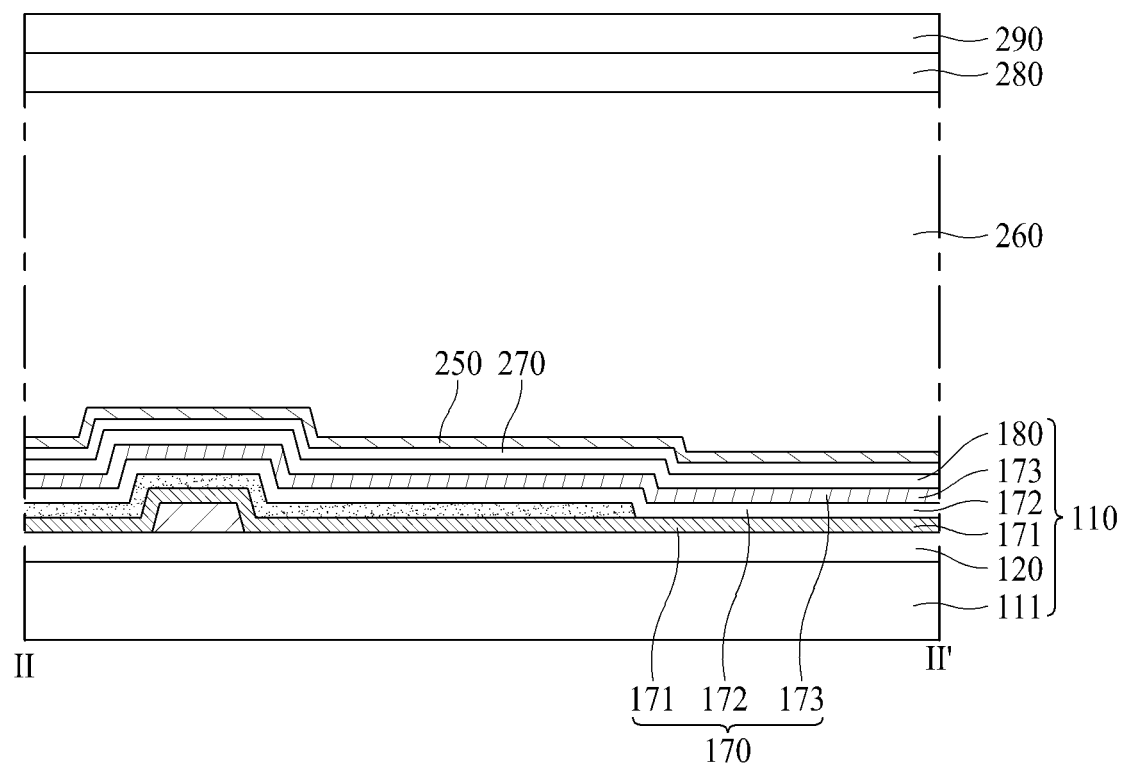
FIG. 4 is a cross-sectional view taken along line II-II' of FIG. 2.

FIG. 1 is a plane view illustrating a lighting device according to one embodiment of the present disclosure, FIG. 2 is an enlarged view illustrating any one light emitting cell of FIG. 1, FIG. 3 is a cross-sectional view taken along line I-I' of FIG. 2, and FIG. 4 is a cross-sectional view taken along line II-II' of FIG. 2.

Referring to FIGS. 1, 2 and 3, the lighting device 100 according to one embodiment of the present disclosure comprises an organic light emitting panel 110, an inorganic light emitting diode 230 on the organic light emitting panel 110, and a first lens structure 241 surrounding the inorganic light emitting diode 230.

The organic light emitting panel 110 includes a plurality of light emitting cells C. The lighting device 100 may emit light by light emission of the light emitting cells C. According to one embodiment of the present disclosure, the light emitting cells may be defined by an auxiliary electrode 130 and a passivation layer 140, which are arranged in a lattice pattern. Referring to FIGS. 1 and 2, the auxiliary electrode 130 and the passivation layer 140 are arranged in a lattice pattern, and therefore the light emitting cells C have a lattice pattern. However, one embodiment of the present disclosure is not limited to this example, and the light emitting cells may have various plane shapes.

Referring to FIG. 3, the organic light emitting panel 110 includes a base substrate 111 and an organic light emitting diode 170 on the base substrate 111.

In detail, the organic light emitting panel 110 includes a base substrate 111, an auxiliary electrode 130 on the base substrate 111, a first electrode 171 on the auxiliary electrode 130, a light emitting layer 172 on the first electrode 171, and a second electrode 173 on the light emitting layer 172.

Glass or plastic may be used as the base substrate 111. A transparent plastic having a flexible characteristic, for example, polyimide may be used as the plastic. If polyimide is used as the base substrate 111, heat-resistant polyimide tolerable at a high temperature may be used considering that a high deposition process is performed on the substrate 111. However, one embodiment of the present disclosure is not limited to this example, and another plastic material may be used as the base substrate 111.

A buffer layer 120 may be arranged on the base substrate 111. The buffer layer 120 may be made of an organic or inorganic insulating material. The buffer layer 120 planarizes an upper surface of the base substrate 111, and protects the organic light emitting diode 170. The buffer layer 120 may be omitted.

The auxiliary electrode 130 is arranged on the buffer layer 120. The auxiliary electrode 130 serves to supply a power source and a current to the first electrode 171. Also, the auxiliary electrode 130 may serve to define the light emitting cells C. Referring to FIG. 1, the light emitting cells C may be identified from one another by the auxiliary electrode 130 arranged in a lattice pattern.

The auxiliary electrode 130 has excellent electric conductivity. The auxiliary electrode 130, for example, may include at least one of Cu, Al, Ag, Mg, Pt, Pd, Au, Ni, Nd, Ir, Cr, Li and Ca. The auxiliary electrode 130 may have a single layered structure or a deposited structure of a plurality of layers.

An auxiliary electrode terminal 135 is arranged on the base substrate 111. The auxiliary electrode terminal 135 is connected with the auxiliary electrode 130, and the power source and the current may be supplied to the auxiliary electrode 130 through the auxiliary electrode terminal 135. The auxiliary electrode terminal 135 may be formed in a single body with the auxiliary electrode 130.

The first electrode 171 is arranged on the auxiliary electrode 130.

The first electrode 171 may be made of ITO(InSnO), IZO(InZnO), ZnO, or $In_2O_3$, which has a great work function. For example, the first electrode 171 may be made of ITO. According to one embodiment of the present disclosure, the first electrode 171 serves as an anode of the organic light emitting diode 170. Also, the first electrode 171 has light transmittance.

According to one embodiment of the present disclosure, light generated by the organic light emitting diode 170 is emitted to the outside through the base substrate 111. This structure is referred to as a bottom emission type structure. In order to efficiently emit the light generated by the organic light emitting diode 170 to the outside through the base substrate 111, the first electrode 171 has light transmittance.

According to one embodiment of the present disclosure, a passivation layer 140 is arranged on the first electrode 171. In detail, the passivation layer 140 is partially arranged on the first electrode 171 to overlap the auxiliary electrode 130.

The light emitting layer 172 is arranged on the first electrode 171. The light emitting layer 172 is also arranged on the passivation layer 140. According to one embodiment of the present disclosure, the light emitting layer 172 may be arranged on an entire surface of the base substrate 111.

The light emitting layer 172 includes one or more organic light emitting layers. In more detail, the light emitting layer 172 may include one organic light emitting layer, or may include two or more organic light emitting layers deposited up and down. Also, the light emitting layer 172 may further include at least one of a Hole Injection Layer (HIL), a Hole Transport Layer (HTL), an Electron Transport Layer (ETL), and an Electron Injection Layer (EIL). The light emitting layer 172 may emit white light, or may emit any one of red light, blue light and green light. However, one embodiment of the present disclosure is not limited to this example, and the light emitting layer 172 may emit light of another color in addition to white light, red light, blue light and green light.

The second electrode 173 is arranged on the light emitting layer 172.

According to one embodiment of the present disclosure, in order to emit light generated by the inorganic light emitting diode 230 arranged above the second electrode 173 to the outside through the base substrate 111, the second electrode 173 may have light transmittance.

The second electrode 173 may have a multi-layered structure that includes a metal having a small work function, for example, a thin film made of Ag, Mg, Al, Pt, Pd, Au, Ni, Nd, Ir, Cr, Li, or Ca and a light-transmissive film made of ITO, IZO, ZnO, or $In_2O_3$ formed on the thin film.

The second electrode 173 may have excellent conductivity. The second electrode 173, for example, may include at least one of Cu, Al, Ag, Mg, Pt, Pd, Au, Ni, Nd, Ir, Cr, Li and Ca.

The second electrode 173 is connected with a second electrode terminal 175. A power source is supplied to the second electrode 173 of the organic light emitting diode 170 through the second electrode terminal 175. The second electrode terminal 175 may be formed in a single body with the second electrode 173, or may be formed separately from the second electrode 173 and then connected with the second electrode 173.

The second electrode 173 may have a reflective characteristic. Light generated by the light emitting layer 172 may be reflected from the second electrode 173 and then emitted to the outside through the base substrate 111. If the second electrode 173 has a reflective characteristic, light extraction efficiency of the lighting device may be improved.

In one embodiment of the present disclosure, the first electrode 171, the light emitting layer 172 and the second electrode 173 constitute the organic light emitting diode 170. Therefore, the lighting device 100 according to one embodiment of the present disclosure uses the organic light emitting diode 170 as a light source.

Referring to FIG. 3, an encapsulation layer 180 is arranged on the second electrode 173 of the organic light emitting diode 170. The encapsulation layer 180 may include an organic film or an inorganic film. The encapsulation layer 180 may have a deposited structure of one or more organic films and one or more inorganic films, which are deposited alternately. The encapsulation layer 180 serves to prevent water or oxygen from being permeated into the organic light emitting diode 170, thereby preventing the organic light emitting diode 170 from being damaged by water or oxygen.

The lighting device 100 according to one embodiment of the present disclosure comprises a passivation layer 140 and a short reduction pattern 141.

Referring to FIGS. 3 and 4, the passivation layer 140 is arranged between the first electrode 171 and the light emitting layer 172. The passivation layer 140 insulates the first electrode 171 and the light emitting layer 172 from each other above the auxiliary electrode 130, and also insulates the first electrode 171 and the light emitting layer 172 from each other at a side of the auxiliary electrode 130. In this way, the first electrode 171 and the light emitting layer 172 are insulated from each other above the auxiliary electrode 130 and at the side of the auxiliary electrode 130. Therefore, light is emitted from an area other than the area where the auxiliary electrode 130 and the passivation layer 140 are arranged.

Generally, the auxiliary electrode 130 has electric conductivity more excellent than that of the first electrode 171. Therefore, if the passivation layer 140 is not arranged on the first electrode 171 overlapped with the auxiliary electrode 130, a current is concentrated on the upper portion of the auxiliary electrode 130, whereby light emission is concentrated on the upper portion of the auxiliary electrode 130. In this case, light emission is not generated on the entire surface of the organic light emitting panel 110 but concentrated on a specific portion, whereby lighting efficiency of the lighting device 100 may be deteriorated. Also, if light emission is concentrated on the upper portion of the auxiliary electrode 130 due to concentration of the current on the upper portion of the auxiliary electrode 130, the light emitting layer 172 may be damaged on the upper portion of the auxiliary electrode 130.

To avoid such a damage, according to one embodiment of the present disclosure, the passivation layer 140 is arranged on the first electrode 171 overlapped with the auxiliary electrode 130, whereby the first electrode 171 and the light emitting layer 172 are insulated from each other on the upper portion of the auxiliary electrode 130. As a result, light emission is not generated on the upper portion of the auxiliary electrode 130 but generated on the other area.

Referring to FIGS. 2 and 3, the short reduction pattern 141 is formed in the first electrode 171. For example, an insulating material may be filled in a groove formed in the first electrode 171 to form the short reduction pattern 141.

According to one embodiment of the present disclosure, the short reduction pattern 141 is connected with the passivation layer 140. The short reduction pattern 141 may be formed in a single body with the passivation layer 140 to serve as an insulating pattern.

Also, referring to FIGS. 2 and 3, the first electrode 171 is partially divided by the double short reproduction pattern 141, whereby a connection line 171a is formed in the first electrode 171. The current supplied from the auxiliary electrode 130 may be supplied to the other area of the first electrode 171 through the connection line 171a. The connection line 171a has a thin width.

According to one embodiment of the present disclosure, the connection line 171a serves to prevent the current from being concentrated on any one light emitting cell C. Also, the connection line 171a may be opened by overcurrent. In this case, the connection line 171a may serve as a fuse.

In detail, since the organic light emitting diode 170 has a deposited structure of thin layers, short may occur between the respective layers. For example, if a damage occurs in the light emitting layer 172 of any one light emitting cell C, or if particles remain therein, short may occur between the first electrode 171 and the second electrode 173. If this short occurs, the current is concentrated on the light emitting cell C where short occurs. As a result, a sufficient current is not supplied to the other light emitting cells C, whereby light emission is not generated but generated in only the light emitting cell where short occurs. For this reason, light emission efficiency of the lighting device 100 may be deteriorated. Also, if current concentration occurs, lifetime of the light emitting layer 172 may be reduced.

According to one embodiment of the present disclosure, the connection line 171a having a thin width and a relatively high resistance is arranged in the light emitting cell C, and the current is supplied to the first electrode 171 through the connection line 171a. Therefore, even though short occurs between the first electrode 171 and the second electrode 173 of any one light emitting cell C, there is limitation in the current that may flow through the connection line 171a, whereby the current is prevented from being concentrated on the first electrode 171 of the light emitting cell C where short occurs. Finally, current concentration on the light emitting cell C where short occurs is avoided, and light emission may occur in the other light emitting cells C.

Also, according to one embodiment of the present disclosure, if short occurs between the first electrode 171 and the second electrode 173 of any one light emitting cell C and therefore the current is concentrated on the light emitting cell C where short occurs, the current is concentrated on the connection line 171a, whereby the connection line 171a may be damaged and therefore opened. In detail, since the connection line 171a has a thin width, the connection line 171a may be opened due to burning or damage caused by current concentration. If the connection line 171a is opened due to burning or damage, the current does not flow any more through the light emitting cell where short occurs. As a result, the current concentration is avoided, and light emission is not generated in the light emitting cell C where short occurs. However, since light emission may normally be generated in the other light emitting cells C, the lighting device 100 may perform a lighting function.

The lighting device 100 according to one embodiment of the present disclosure further comprises an inorganic light emitting diode 230 on the organic light emitting panel 110. The inorganic light emitting diode 230 is connected with an n type electrode line 210 and a p type electrode line 220 on the organic light emitting panel 110.

Referring to FIGS. 1, 2 and 3, the lighting device 100 according to one embodiment of the present disclosure comprises an n type electrode line 210 and a p type electrode line 220 on the organic light emitting panel 110. The n type electrode line 210 and the p type electrode line 220 are spaced apart from each other and then respectively connected with the inorganic light emitting diode 230.

According to one embodiment of the present disclosure, at least a portion of each of the n type electrode line 210 and the p type electrode line 220 is overlapped with the auxiliary electrode 130. In more detail, the n type electrode line 210 and the p type electrode line 220 may be arranged on the passivation layer 140. In this way, as the n type electrode line 210 and the p type electrode line 220 are arranged on the non-light emitting area, loss of the light emitting area due to the n type electrode line 210 and the p type electrode line 220 may be minimized.

Also, as the inorganic light emitting diode 230 is also arranged on the passivation layer 140, loss of the light emitting area due to the inorganic light emitting diode 230 may be minimized.

The n type electrode line 210 and the p type electrode line 220 have excellent electric conductivity. Each of the n type electrode line 210 and the p type electrode line 220, for example, may include at least one of Cu, Al, Ag, Mg, Pt, Pd, Au, Ni, Nd, Ir, Cr, Li and Ca. Each of the n type electrode line 210 and the p type electrode line 220 may have a single layered structure or a deposited structure of a plurality of layers.

Referring to FIG. 1, an n type electrode line terminal 215 is arranged on the base substrate 111. The n type electrode line terminal 215 is connected with the n type electrode line 210. A power source and a current may be supplied to the n type electrode line 210 through the n type electrode line terminal 215. The n type electrode line terminal 215 and the n type electrode line 210 may be formed in a single body. The n type electrode line terminal 215 may be arranged on the organic light emitting panel 110.

Referring to FIG. 1, a p type electrode line terminal 225 is arranged on the base substrate 111. The p type electrode line terminal 225 is connected with the p type electrode line 220. A power source and a current may be supplied to the p type electrode line 220 through the p type electrode line terminal 225. The p type electrode line terminal 225 and the p type electrode line 220 may be formed in a single body. The p type electrode line terminal 225 may be arranged on the organic light emitting panel 110.

Referring to FIG. 3, the inorganic light emitting diode 230 includes an n type electrode 232, an n type semiconductor layer 233 connected with the n type electrode 232, an active layer 234 connected with the n type semiconductor layer 233, a p type semiconductor layer 235 connected with the active layer 234, and a p type electrode 236 connected with the p type semiconductor layer 235.

According to one embodiment of the present disclosure, the n type semiconductor layer 233 and the p type semiconductor layer 235 may include GaN. For example, GaN based diode may be used as the inorganic light emitting diode 230. In more detail, a Ti/Al film, a Cr/Au film, a Cr/Au film or an Ni/Au film may be used as the n type electrode 232, an n type GaN layer may be used as the n type semiconductor layer 233, an InGaN active layer may be used as the active layer 234, a p type GaN layer may be used as the p type semiconductor layer 235, and a p type reflective electrode may be used as the p type electrode 236.

According to one embodiment of the present disclosure, the inorganic light emitting diode 230 may emit a blue light, may emit a green light or a red light, or may emit light of another color such as a white light. According to one embodiment of the present disclosure, the light generated in the inorganic light emitting diode 230 may be emitted to the outside of the inorganic light emitting diode 230 through the n type GaN layer which is the n type semiconductor layer 233.

The n type electrode 232 may be connected with the n type electrode line 210, and the p type electrode 236 may be connected with the p type electrode line 220. In more detail, the inorganic light emitting diode 230 may further include an n type pad 231 connected with the n type electrode 232 and a p type pad 237 connected with the p type electrode 236. Therefore, the n type electrode 232 may be connected with the n type electrode line 210 through the n type pad 231, and the p type electrode 236 may be connected with the p type electrode line 220 through the p type pad 237.

Referring to FIG. 3, the lighting device 100 according to one embodiment of the present disclosure comprises a first lens 241 (which may be referred to herein as a first lens structure 241) at least partially surrounding the inorganic light emitting diode 230. For example, the first lens structure 241 may surround lateral and upper portions of the inorganic light emitting diode 230, and the first lens structure 241 may be disposed on the organic light emitting panel 110 such that the inorganic light emitting diode 230 is encapsulated or otherwise surrounded by the first lens structure 241 and the organic light emitting panel 110. The first lens structure 241 protects and fixes the inorganic light emitting diode 230.

The first lens structure 241 may be made of a polymer resin having light transmittance. For example, the first lens structure 241 may be made of at least one selected from an acrylic resin having light transmittance and a polymer resin of polyimide, polyamide, polycarbonate, polystyrene and polyethylene terephthalate. However, a type of the polymer resin is not limited to the above examples, and the first lens structure 241 may be made of another light-transmissive polymer known in the art.

Referring to FIG. 3, the lighting device 100 may further comprise a conductor layer 250 on the first lens structure 241.

The conductor layer 250 has electric conductivity, and may be connected with the second electrode 173 of the organic light emitting diode 170. Also, an insulating layer 270 may be arranged between the conductor layer 250 and the encapsulation layer 180. The insulating layer 270 insulates the n type electrode line 210 and the p type electrode line 220 arranged on the encapsulation layer 180 from the conductor layer 250 (see FIGS. 7 and 8).

Referring to FIG. 3, the conductor layer 250 may be connected with the second electrode 173 of the organic light emitting diode 170 through a contact hole 255 formed in the encapsulation layer 180. Also, the conductor layer 250 may be connected with the second electrode terminal 175. As a result, the conductor layer 250 may supply a power source to the second electrode 173 of the organic light emitting diode 170.

In order to supply the power source to the second electrode 173, the conductor layer 250 may be made of a metal having excellent electric conductivity. The conductor layer 250, for example, may include at least one of Cu, Al, Ag, Mg, Pt, Pd, Au, Ni, Nd, Ir, Cr, Li and Ca. The conductor layer 250 may have a single layered structure or a deposited structure of a plurality of layers.

According to one embodiment of the present disclosure, the second electrode 173 has light transmittance. Therefore, the electric conductivity of the second electrode 173 is not excellent as much as a thick metal line. However, if the power source is supplied to the second electrode 173 of the organic light emitting diode 170 by the conductor layer 250, the power source may actively be supplied to the organic light emitting diode 170. As a result, light emission efficiency of the organic light emitting diode 170 may be improved, whereby light emission efficiency of the lighting device 100 may be improved.

According to one embodiment of the present disclosure, the conductor layer 250 has light-reflective characteristic. Therefore, the conductor layer 250 on the first lens structure 241 may form a lens. The light generated in the inorganic light emitting diode 230 may be reflected to the conductor layer 250 and then reflected to the outside through the base substrate 111. Therefore, even though the inorganic light emitting diode 230 is arranged on the auxiliary electrode 130, the light generated from the inorganic light emitting diode 230 may easily be extracted to the outside. In this way, light extraction efficiency of the inorganic light emitting diode may be improved by the first lens structure 241 and the conductor layer 250, whereby light emission efficiency of the lighting device 100 may be improved.

According to one embodiment of the present disclosure, the conductor layer 250 has thermal conductivity. For example, the conductor layer 250 may be formed of a thermally conductive material which conducts heat. Heat generated in the inorganic light emitting diode 230 may be emitted to the outside through the conductor layer 250. Therefore, the inorganic light emitting diode 230 and the organic light emitting diode 170 may be prevented from being damaged by heat. For example, the conductor layer 250 may have a heat emission pattern 251. The heat emission pattern 251 may be connected with an encapsulation film 280 which will be described later. As a result, effective radiation may be performed. In this way, according to one embodiment of the present disclosure, heat inside the lighting device 100 may effectively be emitted, whereby lifetime of the lighting device 100 may be improved.

According to one embodiment of the present disclosure, as shown in FIG. 3, the lighting device 100 may further include an adhesive layer 260 on the conductor layer 250 and the encapsulation film 280 on the adhesive layer 260.

The encapsulation film 280 may be fixed to the upper portion of the organic light emitting diode 170 by the adhesive layer 260. The encapsulation film 280 may be made of metal. For example, a metal film may be used as the encapsulation film 280. The encapsulation film 280 protects the organic light emitting diode 170 by preventing water or oxygen from being permeated into the organic light emitting diode 170, and reflects light to allow the light generated in the organic light emitting diode 170 to be emitted to the outside through the base substrate 111.

Also, heat may be emitted through the encapsulation film 280 made of a metal film. For example, the heat emission pattern 251 of the conductor layer 250 and the encapsulation film 280 are connected with each other to emit heat through the conductor layer 250, the heat emission pattern 251 and the encapsulation film 280, whereby heat inside the lighting device 100 may effectively be emitted.

A passivation layer 290 may be arranged on the encapsulation film 280. The passivation layer 290 may protect the lighting device 100 from an external environment. The passivation layer 290 has water shielding characteristic and oxygen shielding characteristic to prevent water or oxygen from being permeated into the lighting device 100.

Figure 5:
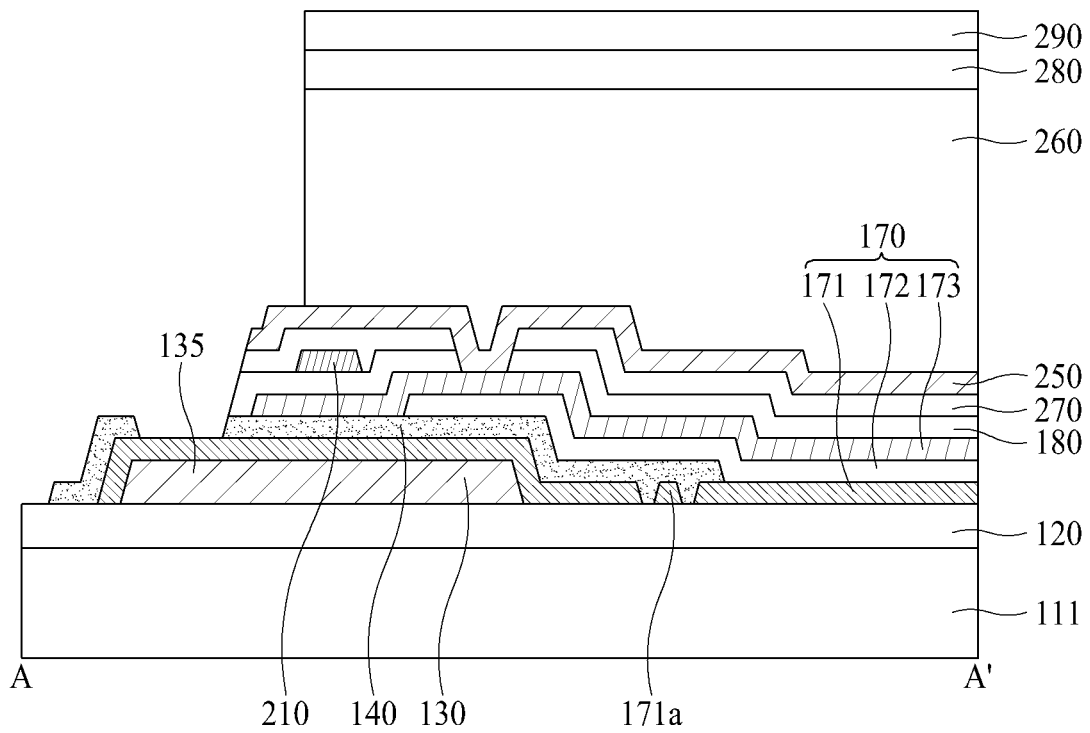
FIG. 5 is a cross-sectional view taken along line A-A' of FIG. 1.

FIG. 5 is a cross-sectional view taken along line A-A' of FIG. 1.

Referring to FIG. 5, the auxiliary electrode terminal 135 is arranged at one side on the base substrate 111 where the light emitting cell C is not arranged. The auxiliary electrode terminal 135 is connected with the auxiliary electrode 130. According to one embodiment of the present disclosure, the auxiliary electrode terminal 135 may be formed in a single body with the auxiliary electrode 130. Referring to FIG. 5, the first electrode 171 may be arranged on the auxiliary electrode terminal 135. An externally supplied power source is transferred to the auxiliary electrode 130 through the auxiliary electrode terminal 135.

Figure 6:
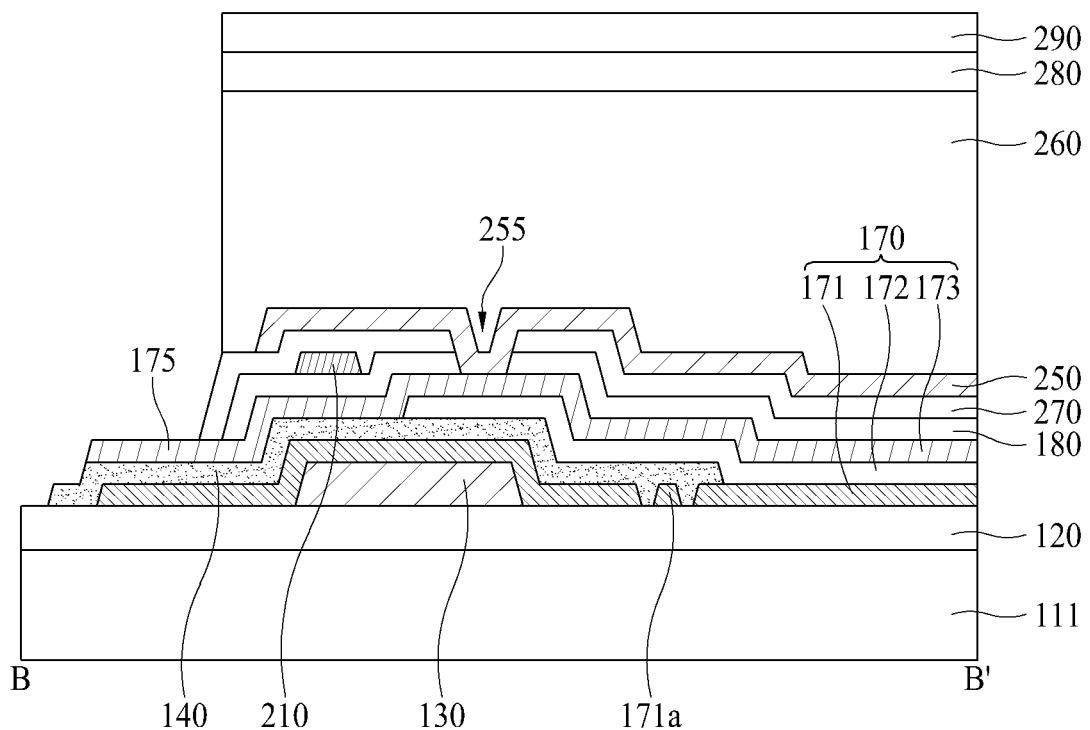
FIG. 6 is a cross-sectional view taken along line B-B' of FIG. 1.

FIG. 6 is a cross-sectional view taken along line B-B' of FIG. 1.

Referring to FIG. 6, the second electrode terminal 175 is arranged at one side on the base substrate 111 where the light emitting cell C is not arranged. In FIG. 6, the second electrode terminal 175 and the second electrode 173 are formed in a single body. Referring to FIG. 6, the second electrode terminal 175 may be arranged on the passivation layer 140. An externally supplied power source is transferred to the second electrode 173 through the second electrode terminal 175.

Figure 7:
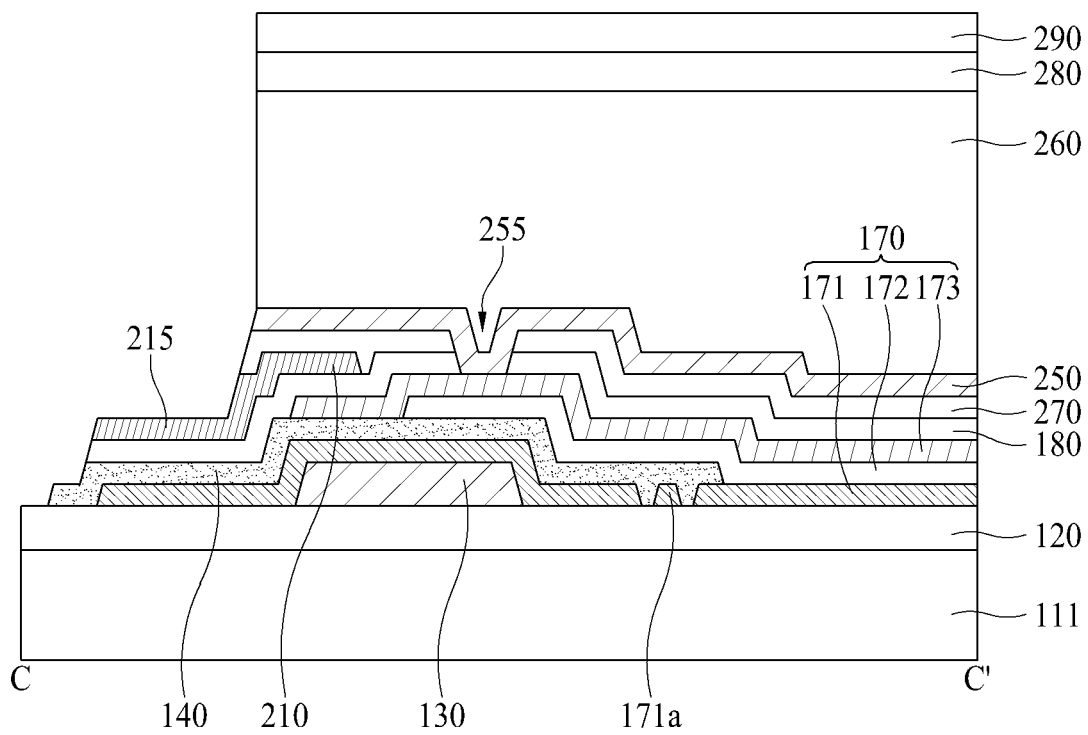
FIG. 7 is a cross-sectional view taken along line C-C' of FIG. 1.

FIG. 7 is a cross-sectional view taken along line C-C' of FIG. 1.

Referring to FIG. 7, the n type electrode line terminal 215 is arranged at one side on the base substrate 111 where the light emitting cell C is not arranged. In FIG. 7, the n type electrode line terminal 215 and the n type electrode line 210 are formed in a single body. Referring to FIG. 7, the n type electrode line terminal 215 may be arranged on the passivation layer 140 and the encapsulation layer 180. An externally supplied power source is transferred to the n type electrode line 210 through the n type electrode line terminal 215.

Figure 8:
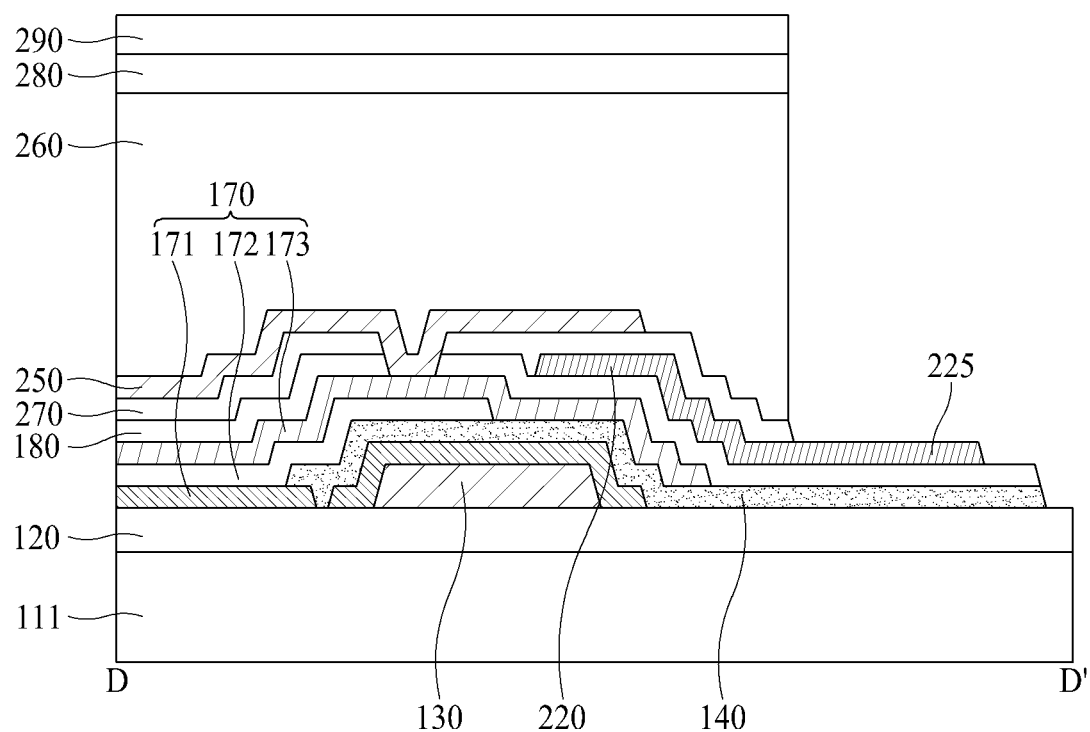
FIG. 8 is a cross-sectional view taken along line D-D' of FIG. 1.

FIG. 8 is a cross-sectional view taken along line D-D' of FIG. 1.

Referring to FIG. 8, the p type electrode line terminal 225 is arranged at one side on the base substrate 111 where the light emitting cell C is not arranged. In FIG. 8, the p type electrode line terminal 225 and the p type electrode line 220 are formed in a single body. Referring to FIG. 8, the p type electrode line terminal 225 may be arranged on the passivation layer 140 and the encapsulation layer 180. An externally supplied power source is transferred to the p type electrode line 220 through the p type electrode line terminal 225.

Figure 9:
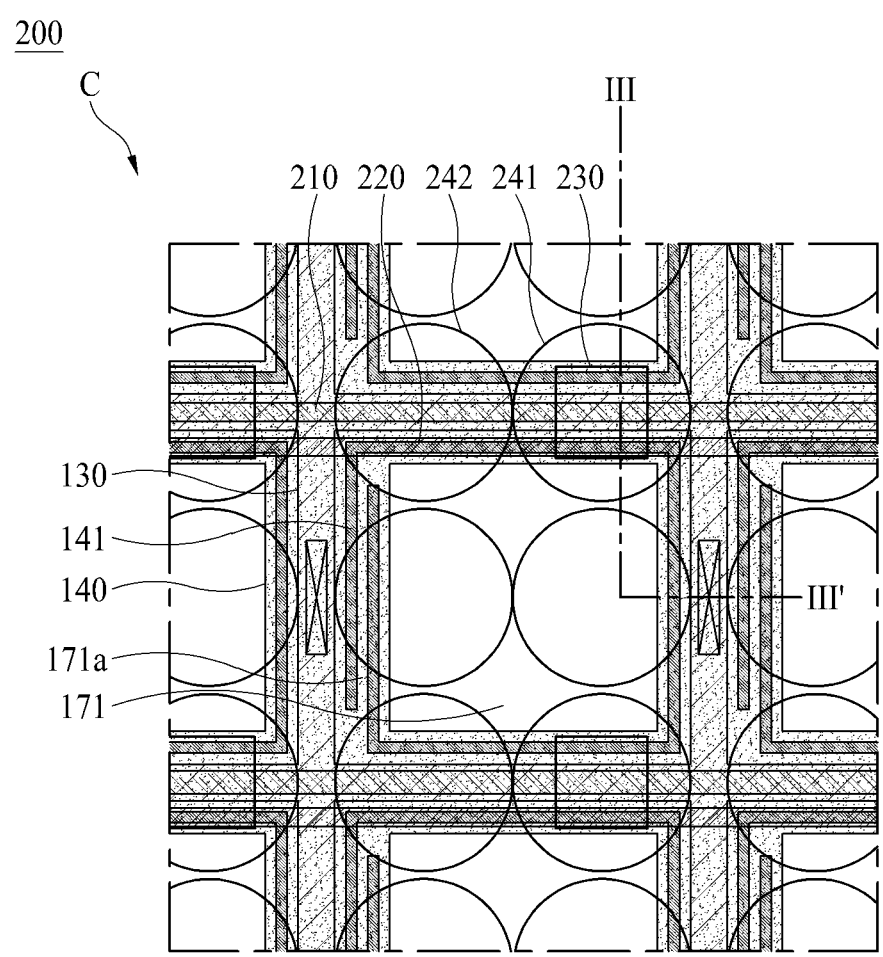
FIG. 9 is an enlarged view illustrating any one light emitting cell of a lighting device according to another embodiment of the present disclosure.
Figure 10:
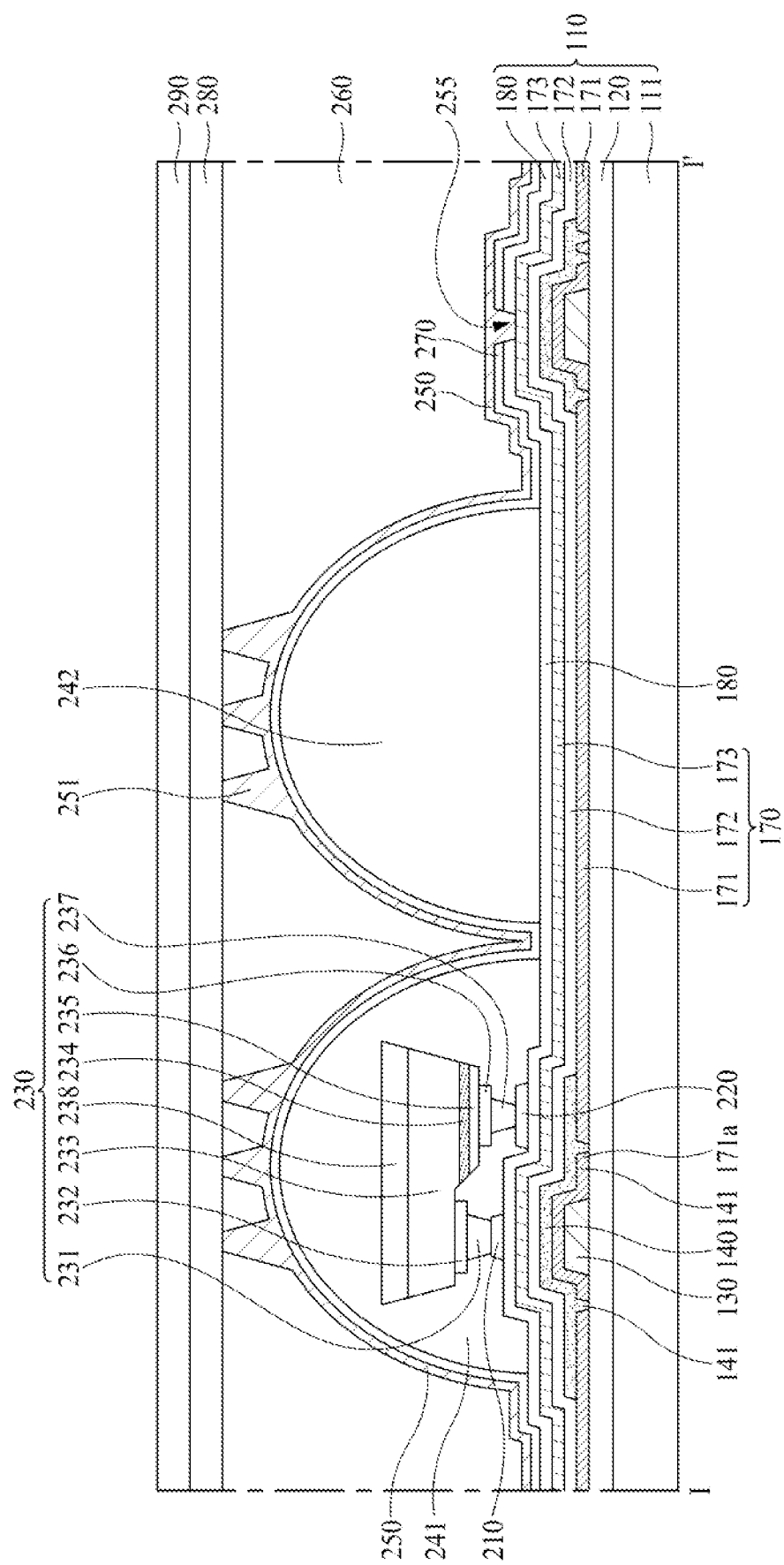
FIG. 10 is a cross-sectional view taken along line III-III' of FIG. 9.

FIG. 9 is an enlarged view illustrating any one light emitting cell of a lighting device 200 according to another embodiment of the present disclosure, and FIG. 10 is a cross-sectional view taken along line III-III' of FIG. 9.

The lighting device 200 according to another embodiment of the present disclosure further comprises a second lens 242 (which may be referred to herein as a second lens structure 242) on the organic light emitting panel 110. The inorganic light emitting diode 230 is not arranged between the organic light emitting panel 110 and the second lens structure 242. For example, the second lens structure 242 may be spaced laterally apart from the inorganic light emitting diode 230, and the second lens structure 242 may be disposed adjacent to, and in some embodiments may contact, the first lens structure 241.

Also, referring to FIG. 10, the conductor layer 250 is arranged on the second lens structure 242. As the conductor layer 250 having a light reflective characteristic is arranged on the second lens structure 242, a lens is formed by the second lens structure 242 and the conductor layer 250. The light generated in the organic light emitting diode 170 may be reflected to the conductor layer 250 and emitted to the outside through the base substrate 111. Therefore, light emission efficiency of the lighting device 100 may be improved.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A lighting device, comprising:
an organic light emitting panel;
an inorganic light emitting diode on the organic light emitting panel; and
a first lens at least partially surrounding the inorganic light emitting diode,
wherein the organic light emitting panel includes:
a base substrate;
an auxiliary electrode on the base substrate, the auxiliary electrode arranged in a lattice pattern;
a first electrode on the auxiliary electrode;
a passivation layer on the first electrode;
a light emitting layer on the first electrode;
a second electrode on the light emitting layer; and
an encapsulation layer on the second electrode,
wherein at least a portion of the inorganic light emitting diode overlaps with the auxiliary electrode.

2. The lighting device of claim 1, wherein the passivation layer is overlapped with the auxiliary electrode.

3. The lighting device of claim 1, wherein the passivation layer is arranged between the first electrode and the light emitting layer.

4. The lighting device of claim 1, further comprising a short reduction pattern including a groove formed in the first electrode and an insulating material in the groove.

5. The lighting device of claim 4, wherein the short reduction pattern is connected with the passivation layer.

6. The lighting device of claim 1, further comprising a second lens on the organic light emitting panel, wherein the inorganic light emitting diode is not arranged between the organic light emitting panel and the second lens.

7. The lighting device of claim 6, wherein the second lens is spaced laterally apart from the inorganic light emitting diode.

8. The lighting device of claim 6, wherein the second lens contacts the first lens.

9. A lighting device, comprising:
an organic light emitting panel;
an inorganic light emitting diode on the organic light emitting panel;
a first lens at least partially surrounding the inorganic light emitting diode; and
an n type electrode line and a p type electrode line on the organic light emitting panel,
wherein the n type electrode line and the p type electrode line are spaced apart from each other and respectively connected with the inorganic light emitting diode, and
wherein the organic light emitting panel includes:
a base substrate;
an auxiliary electrode on the base substrate;
a first electrode on the auxiliary electrode;
a passivation layer on the first electrode;
a light emitting layer on the first electrode;
a second electrode on the light emitting layer; and
an encapsulation layer on the second electrode.

10. The lighting device of claim 9, wherein at least a portion of each of the n type electrode line and the p type electrode line is overlapped with the auxiliary electrode.

11. The lighting device of claim 9, wherein the n type electrode line and the p type electrode line are arranged on the passivation layer.

12. The lighting device of claim 9, wherein the inorganic light emitting diode includes:
an n type electrode;
an n type semiconductor layer connected with the n type electrode;
an active layer connected with the n type semiconductor layer;
a p type semiconductor layer connected with the active layer; and
a p type electrode connected with the p type semiconductor layer, and
wherein the n type electrode is connected with the n type electrode line, and the p type electrode is connected with the p type electrode line.

13. A lighting device, comprising:
an organic light emitting panel;
an inorganic light emitting diode on the organic light emitting panel;
a first lens at least partially surrounding the inorganic light emitting diode; and
a conductor layer on the first lens,
wherein the organic light emitting panel includes:
a base substrate;
an auxiliary electrode on the base substrate;
a first electrode on the auxiliary electrode;
a passivation layer on the first electrode;
a light emitting layer on the first electrode;
a second electrode on the light emitting layer; and
an encapsulation layer on the second electrode.

14. The lighting device of claim 13, wherein the conductor layer is connected with the second electrode of the organic light emitting panel.

15. The lighting device of claim 13, wherein the conductor layer has a light reflective characteristic.

16. The lighting device of claim 13, wherein the conductor layer is thermally conductive.

17. The lighting device of claim 13, further comprising:
an adhesive layer on the conductor layer; and
an encapsulation film on the adhesive layer,
wherein the conductor layer is connected with the encapsulation film.

* * * * *